(12) United States Patent
Cai et al.

(10) Patent No.: US 10,340,342 B2
(45) Date of Patent: Jul. 2, 2019

(54) SEMICONDUCTOR DEVICE AND MANUFACTURE THEREOF

(71) Applicants: Semiconductor Manufacturing International (Shanghai) Corporation, Shanghai (CN); Semiconductor Manufacturing International (Beijing) Corporation, Beijing (CN)

(72) Inventors: JianXiang Cai, Shanghai (CN); YiQi Wang, Shanghai (CN); WeiLi Zhao, Shanghai (CN); XiaoFang Yang, Shanghai (CN); JingGuo Jia, Shanghai (CN)

(73) Assignees: SEMICONDUCTOR MANUFACTURING INTERNATIONAL (SHANGHAI) CORPORATION (CN); SEMICONDUCTOR MANUFACTURING INTERNATIONAL (BEIJING) CORPORATION (CN)

( * ) Notice: Subject to any disclaimer, the term of this patent is extended or adjusted under 35 U.S.C. 154(b) by 0 days.

(21) Appl. No.: 15/863,733

(22) Filed: Jan. 5, 2018

(65) Prior Publication Data

US 2018/0204911 A1 Jul. 19, 2018

(30) Foreign Application Priority Data

Jan. 19, 2017 (CN) .......................... 2017 1 0037076

(51) Int. Cl.
*H01L 29/08* (2006.01)
*H01L 27/06* (2006.01)
(Continued)

(52) U.S. Cl.
CPC ...... *H01L 29/0804* (2013.01); *H01L 21/8249* (2013.01); *H01L 27/0623* (2013.01);
(Continued)

(58) Field of Classification Search
CPC .......... H01L 29/0804; H01L 29/66272; H01L 29/0649; H01L 29/7395; H01L 29/66333;
(Continued)

(56) References Cited

U.S. PATENT DOCUMENTS

| | | | | |
|---|---|---|---|---|
| 6,297,119 B1 * | 10/2001 | Tsutsui | .............. | H01L 21/82285 257/E21.612 |
| 8,212,292 B2 * | 7/2012 | Lin | ..................... | H01L 29/7322 257/163 |
| 2015/0155279 A1 * | 6/2015 | Konrath | .............. | H01L 27/0823 257/77 |

* cited by examiner

*Primary Examiner* — Sonya D. McCall-Shepard
(74) *Attorney, Agent, or Firm* — Innovation Counsel LLP

(57) ABSTRACT

A semiconductor device and its manufacturing method are presented. The semiconductor device includes a collection region, a base region adjacent to the collection region, an emission region adjacent to the base region, and a doped semiconductor layer on the emission region. The width of the doped semiconductor layer is larger than the width of the emission region, a conductive type (e.g., P-type or N-type) of the doped semiconductor layer is the same as a conductive type of the emission region. In this inventive concept, the width of the doped semiconductor layer on the emission region is larger than the width of the emission region, that equivalently increases the width of the emission region, which in turn increases the DC amplification factor ($\beta$) and therefore improves the overall performance of the semiconductor device.

20 Claims, 11 Drawing Sheets

(51) Int. Cl.
  *H01L 21/8249* (2006.01)
  *H01L 29/66* (2006.01)
  *H01L 29/10* (2006.01)
  *H01L 29/739* (2006.01)
  *H01L 29/732* (2006.01)
  *H01L 29/06* (2006.01)
  *H01L 29/45* (2006.01)

(52) U.S. Cl.
  CPC ...... *H01L 29/0649* (2013.01); *H01L 29/0821* (2013.01); *H01L 29/1004* (2013.01); *H01L 29/456* (2013.01); *H01L 29/66295* (2013.01); *H01L 29/66333* (2013.01); *H01L 29/732* (2013.01); *H01L 29/7395* (2013.01); *H01L 29/66272* (2013.01)

(58) Field of Classification Search
  CPC ............. H01L 21/8249; H01L 21/8248; H01L 29/0808; H01L 21/8222; H01L 27/0259; H01L 27/0623; H01L 27/0635; H01L 27/0647; H01L 27/0711; H01L 27/14681; H01L 29/0821; H01L 29/1004; H01L 29/1008; H01L 29/41708; H01L 29/42304; H01L 29/66234–66348; H01L 29/70–749; H01L 2924/1305–13056; H01L 21/8224; H01L 21/82285; H01L 27/0652; H01L 27/0658; H01L 27/0755–0777; H01L 27/15; H01L 33/0075; H01L 23/60; H01L 33/0079; H01L 33/382; H01L 33/405; H01L 2924/0002; H01L 2924/13051; H01L 29/73; H01L 29/737; H01L 29/66318
  See application file for complete search history.

SEMICONDUCTOR DEVICE AND MANUFACTURE THEREOF

CROSS-REFERENCE TO RELATED APPLICATION

This application claims priority to and benefit of Chinese Patent Application No. 201710037076.5 filed on Jan. 19, 2017, which is incorporated herein by reference in its entirety.

BACKGROUND (a) Field of the Invention

This inventive concept relates to semiconductor technology, and more specifically to a semiconductor device and its manufacturing method.

(b) Description of the Related Art

The DC amplification factor ($\beta$) of a Bipolar Junction Transistor (BJT) is proportional to the width of its emission region, and inversely proportional to the width of its base region. Typically, a wide emission region can be obtained by a high-energy or high-dose ion implantation process. However, a high-energy or high-dose ion implantation process can also lead to high density of crystal defects in the base region, and cause leakage current or even short circuit between the emission region and its collection region.

In most semiconductor circuits or devices, BJT is a parasitic device. For example, it could be a parasitic device located beside a Metal Oxide Semiconductor (MOS) device. Therefore, the widths of its emission region and base region are limited in the MOS device, and optimizing their widths would require additional hard mask and could adversely affect the overall performance of the MOS device.

SUMMARY

The inventors of this inventive concept investigated the issues in conventional manufacturing methods and proposed an innovative solution that remedies at least one issue of the conventional methods.

This inventive concept first presents a semiconductor device, comprising:

a collection region;

a base region adjacent to the collection region;

an emission region adjacent to the base region; and a doped semiconductor layer on the emission region, wherein the width of the doped semiconductor layer is larger than the width of the emission region, a conductive type of the doped semiconductor layer is the same as a conductive type of the emission region.

Additionally, in the aforementioned device, the doped semiconductor layer may comprise poly-silicon.

Additionally, in the aforementioned device, the base region may comprise:

a first base region, wherein the collection region is located on one side of the first base region;

a second base region; and a third base region, wherein both the second base region and the third base region are located on a side of the first base region opposite the side that is closest to the collection region, the second base region and the third base region are separated from each other, and the second base region is located between the emission region and the first base region.

Additionally, the aforementioned device may further comprise a metal silicide layer on a portion of the third base region and a portion of the second base region adjacent to the doped semiconductor layer.

Additionally, in the aforementioned device, the third base region may comprise:

a first part and a second part stacked together, wherein the first part is located closer to the first base region than the second part, a doping concentration of the second part is higher than a doping concentration of the first part, and the second part has the metal silicide layer formed thereon.

Additionally, the aforementioned device may further comprise:

a first well region adjacent to the first base region and positioned next to the first base region along a first direction along which the second base region and the third base region are located;

a second well region and a third well region separately located along the first direction on a same side of the first well region;

a fourth well region whose doping concentration is higher than a doping concentration of the third well region, wherein the third well region is located between the fourth well region and the first well region;

a gate structure on the second well region; and a source region and a drain region both located in the second well region and on two sides of the gate structure.

Additionally, the aforementioned device may further comprise a metal silicide layer on the source region, the fourth well region, and the drain region.

Additionally, the aforementioned device may further comprise a first groove isolation separating the third base region from the second base region and the emission region.

Additionally, the aforementioned device may further comprise a second groove isolation separating the second well region from the third well region and the fourth well region.

This inventive concept further presents a semiconductor device manufacturing method, comprising:

providing a semiconductor structure, wherein the semiconductor structure comprises a collection region, a base region adjacent to the collection region, and an emission region adjacent to the base region; and forming a doped semiconductor layer on the emission region, wherein the width of the doped semiconductor layer is larger than the width of the emission region, and a conductive type of the doped semiconductor layer is the same as a conductive type of the emission region.

Additionally, in the aforementioned method, the doped semiconductor layer may comprise poly-silicon.

Additionally, in the aforementioned method, the base region may comprise:

a first base region, wherein the collection region is located on one side of the first base region;

a second base region; and a third base region, wherein both the second base region and the third base region are located on a side of the first base region opposite the side that is closest to the collection region, the second base region and the third base region are separated from each other, and the second base region is located between the emission region and the first base region.

Additionally, in the aforementioned method, forming a doped semiconductor layer on the emission region may comprise:

forming an undoped semiconductor layer on the semiconductor structure;

patterning the undoped semiconductor layer to separate it into a first semiconductor component and a second second semiconductor component, wherein the first semiconductor component is on the emission region, the width of the first semiconductor component is larger than the width of the emission region, and the second semiconductor component is on the third base region;

conducting a first doping process on the first semiconductor component to make a conductive type of the first semiconductor component the same as a conductive type of the emission region; and conducting a second doping process on the second semiconductor component to make a conductive type of the second semiconductor component the same as a conductive type of the base region.

Additionally, the aforementioned method may further comprise:

forming a block layer on a portion of the first semiconductor component;

forming a metal layer on the second semiconductor component and a portion of the first semiconductor component not covered by the block layer;

forming a metal silicide layer by conducting a heat treatment to make the metal layer react with the semiconductor components it contacts, wherein a portion of the metal silicide layer is formed on the third base region and another portion of the metal silicide layer is formed on the second base region and contacts the doped semiconductor layer; and removing the block layer.

Additionally, in the aforementioned method, the third base region may comprise:

a first part and a second part stacked together, wherein the first part is located closer to the first base region than the second part, a doping concentration of the second part is higher than a doping concentration of the first part, and the second part has the metal silicide layer formed on it.

Additionally, in the aforementioned method, the semiconductor structure may further comprise:

a first well region adjacent to the first base region and positioned next to the first base region along a first direction along which the second base region and the third base region are located;

a second well region and a third well region separately located along the first direction on a same side of the first well region;

a fourth well region whose doping concentration is higher than a doping concentration of the third well region, wherein the third well region is located between the fourth well region and the first well region;

a gate structure on the second well region; and a source region and a drain region both located in the second well region and on two sides of the gate structure.

Additionally, in the aforementioned method, when patterning the undoped semiconductor layer, the undoped semiconductor layer may be further separated into a third semiconductor component separating from the first semiconductor component, and a fourth semiconductor component separating from the third semiconductor component, and wherein the third semiconductor component may be on the source region and the fourth well region, and the fourth semiconductor component may be on the drain region.

Additionally, in the aforementioned method, conductive types of the base region, the source region, and the drain region may be the same, and when conducting the second doping process on the second semiconductor component, the second doping process may also be conducted on the third semiconductor component and the fourth semiconductor component.

Additionally, in the aforementioned method, the semiconductor structure may further comprise:

a first groove isolation separating the third base region from the second base region and the emission region.

Additionally, in the aforementioned method, the semiconductor structure may further comprise:

a second groove isolation separating the second well region from the third well region and the fourth well region.

BRIEF DESCRIPTION OF THE DRAWINGS

The drawings, as part of this application, illustrate some embodiments of this inventive concept and will be used to describe this inventive concept along with the specification.

DETAILED DESCRIPTION OF THE EMBODIMENTS

Figure 1:
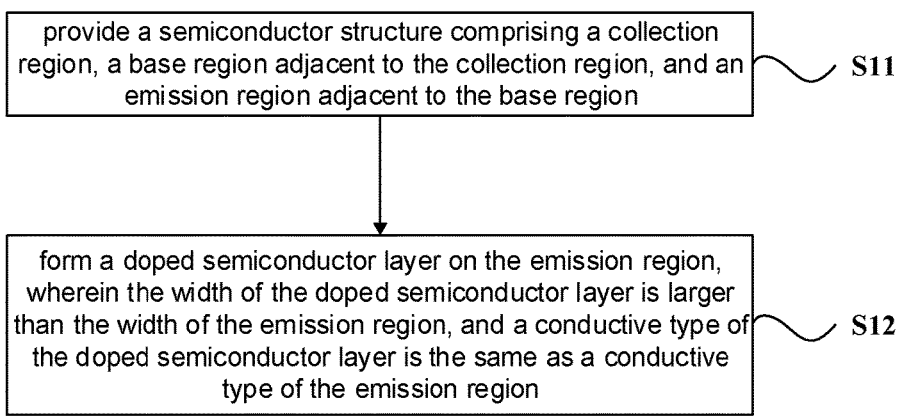
FIG. 1 shows a flowchart illustrating a semiconductor device manufacturing method in accordance with one or more embodiments of this inventive concept.

Example embodiments of the inventive concept are described with reference to the accompanying drawings. As those skilled in the art would realize, the described embodiments may be modified in various ways without departing from the spirit or scope of the inventive concept. Embodiments may be practiced without some or all of these specified details. Well known process steps and/or structures may not be described in detail, in the interest of clarity.

The drawings and descriptions are illustrative and not restrictive. Like reference numerals may designate like (e.g., analogous or identical) elements in the specification. To the extent possible, any repetitive description will be minimized.

Relative sizes and thicknesses of elements shown in the drawings are chosen to facilitate description and understanding, without limiting the inventive concept. In the drawings, the thicknesses of some layers, films, panels, regions, etc., may be exaggerated for clarity.

Embodiments in the figures may represent idealized illustrations. Variations from the shapes illustrated may be possible, for example due to manufacturing techniques and/or tolerances. Thus, the example embodiments shall not be construed as limited to the shapes or regions illustrated herein but are to include deviations in the shapes. For example, an etched region illustrated as a rectangle may have rounded or curved features. The shapes and regions illustrated in the figures are illustrative and shall not limit the scope of the embodiments.

Although the terms "first," "second," etc. may be used herein to describe various elements, these elements shall not be limited by these terms. These terms may be used to distinguish one element from another element. Thus, a first element discussed below may be termed a second element without departing from the teachings of the present inventive concept. The description of an element as a "first" element may not require or imply the presence of a second element or other elements. The terms "first," "second," etc. may also be used herein to differentiate different categories or sets of elements. For conciseness, the terms "first," "second," etc. may represent "first-category (or first-set)," "second-category (or second-set)," etc., respectively.

If a first element (such as a layer, film, region, or substrate) is referred to as being "on," "neighboring," "connected to," or "coupled with" a second element, then the first element can be directly on, directly neighboring, directly connected to or directly coupled with the second element, or an intervening element may also be present between the first element and the second element. If a first element is referred to as being "directly on," "directly neighboring," "directly connected to," or "directly coupled with" a second element, then no intended intervening element (except environmental elements such as air) may also be present between the first element and the second element.

Spatially relative terms, such as "beneath," "below," "lower," "above," "upper," and the like, may be used herein for ease of description to describe one element or feature's spatial relationship to another element(s) or feature(s) as illustrated in the figures. It will be understood that the spatially relative terms may encompass different orientations of the device in use or operation in addition to the orientation depicted in the figures. For example, if the device in the figures is turned over, elements described as "below" or "beneath" other elements or features would then be oriented "above" the other elements or features. Thus, the term "below" can encompass both an orientation of above and below. The device may be otherwise oriented (rotated 90 degrees or at other orientation), and the spatially relative descriptors used herein shall be interpreted accordingly.

The terminology used herein is for the purpose of describing particular embodiments and is not intended to limit the inventive concept. As used herein, singular forms, "a," "an," and "the" may indicate plural forms as well, unless the context clearly indicates otherwise. The terms "includes" and/or "including," when used in this specification, may specify the presence of stated features, integers, steps, operations, elements, and/or components, but may not preclude the presence or addition of one or more other features, integers, steps, operations, elements, components, and/or groups.

Unless otherwise defined, terms (including technical and scientific terms) used herein have the same meanings as what is commonly understood by one of ordinary skill in the art related to this field. Terms, such as those defined in commonly used dictionaries, shall be interpreted as having meanings that are consistent with their meanings in the context of the relevant art and shall not be interpreted in an idealized or overly formal sense unless expressly so defined herein.

The term "connect" may mean "electrically connect." The term "insulate" may mean "electrically insulate."

Unless explicitly described to the contrary, the word "comprise" and variations such as "comprises," "comprising," "include," or "including" may imply the inclusion of stated elements but not the exclusion of other elements.

Various embodiments, including methods and techniques, are described in this disclosure. Embodiments of the inventive concept may also cover an article of manufacture that includes a non-transitory computer readable medium on which computer-readable instructions for carrying out embodiments of the inventive technique are stored. The computer readable medium may include, for example, semiconductor, magnetic, opto-magnetic, optical, or other forms of computer readable medium for storing computer readable code. Further, the inventive concept may also cover apparatuses for practicing embodiments of the inventive concept. Such apparatus may include circuits, dedicated and/or programmable, to carry out operations pertaining to embodiments of the inventive concept. Examples of such apparatus include a general purpose computer and/or a dedicated computing device when appropriately programmed and may include a combination of a computer/computing device and dedicated/programmable hardware circuits (such as electrical, mechanical, and/or optical circuits) adapted for the various operations pertaining to embodiments of the inventive concept.

FIG. 1 shows a flowchart illustrating a semiconductor device manufacturing method in accordance with one or more embodiments of this inventive concept.

In step S11, a semiconductor structure is provided. The semiconductor structure comprises a collection region, a base region adjacent to the collection region, and an emission region adjacent to the base region. This semiconductor structure can be used to form a BJT.

In step S12, a doped semiconductor layer is formed on the emission region. The width of the doped semiconductor layer is larger than the width of the emission region, a conductive type (e.g., P-type or N-type) of the doped semiconductor layer is the same as a conductive type of the emission region. For example, the doped semiconductor layer may comprise poly-silicon.

In this embodiment, a doped semiconductor layer is formed on the emission region, and the width of the doped semiconductor layer is larger than the width of the emission region. This equivalently increases the width of the emission region, which in turn increases the DC amplification factor ($\beta$) and therefore improves the overall performance of the semiconductor device (e.g., a BJT).

FIGS. 2A, 2B, 2C, 2D, 2E, 2F, 2G 2H, 2I, and 2J show schematic sectional views illustrating different stages of a semiconductor device manufacturing method in accordance with one or more embodiments of this inventive concept. This semiconductor device manufacturing method is described below in reference to these drawings.

Figure 2A:
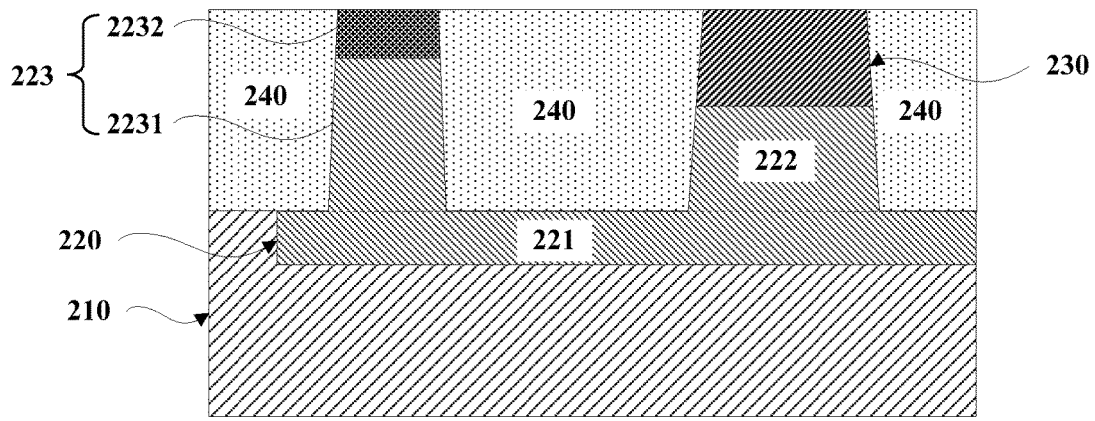
FIGS. 2A, 2B, 2C, 2D, 2E, 2F, 2G 2H, 2I, and 2J show schematic sectional views illustrating different stages of a semiconductor device manufacturing method in accordance with one or more embodiments of this inventive concept.

First, referring to FIG. 2A, a semiconductor structure is provided. The semiconductor structure comprises a collection region 210, a base region 220 adjacent to the collection region 210, and an emission region 230 adjacent to the base region 220.

Referring to FIG. 2A, in some embodiments, the base region 220 may comprise a first base region 221, with the collection region 210 located on one side of the first base region 221. The base region 220 may further comprise a second base region 222 and a third base region 223, both located on a side of the first base region 221 opposite the side on which the collection region 210 is located. The second base region 222 and the third base region 223 are separated from each other, and the second base region 222 is located between the emission region 230 and the first base region 221.

Referring to FIG. 2A, in some embodiments, the third base region 223 may comprise a first part 2231 and a second part 2232 stacked together. The first part 2231 is located closer to the first base region 221 than the second part 2232, and a doping concentration of the second part 2232 is higher than a doping concentration of the first part 2231.

In some embodiments, the semiconductor structure may further comprise: a first groove isolation 240 separating the third base region 223 from the second base region 222 and the emission region 230. The first groove isolation 240 may comprise grooves around the third base region 223, the second base region 222 and the emission region 230, and an insulation layer (e.g., silicon dioxide) filling these grooves.

In one embodiment, an upper surface of the third base region 223 (e.g., an upper surface of the second part 2232), an upper surface of the emission region 230, and an upper surface of the first groove isolation 240 are in a substantially same horizontal level. The dash lines in the drawings, if there is any, serve for an illustration purpose only, and do not represent any structural components in the devices.

In some embodiments, the semiconductor structure shown in FIG. 2A may be used to form a BJT. For example, it may be used to form a N-P-N type BJT (that is, both the emission region and the collection region are N type, and the base region is P type), or a P-N-P type BJT (that is, both the emission region and the collection region are P type, and the base region is N type).

Next, a doped semiconductor layer is formed on the emission region. A process to form a doped semiconductor layer in accordance with one or more embodiments of this inventive concept is described below in reference to FIGS. 2B, 2C, 2D, 2E, and 2F.

Figure 2B:
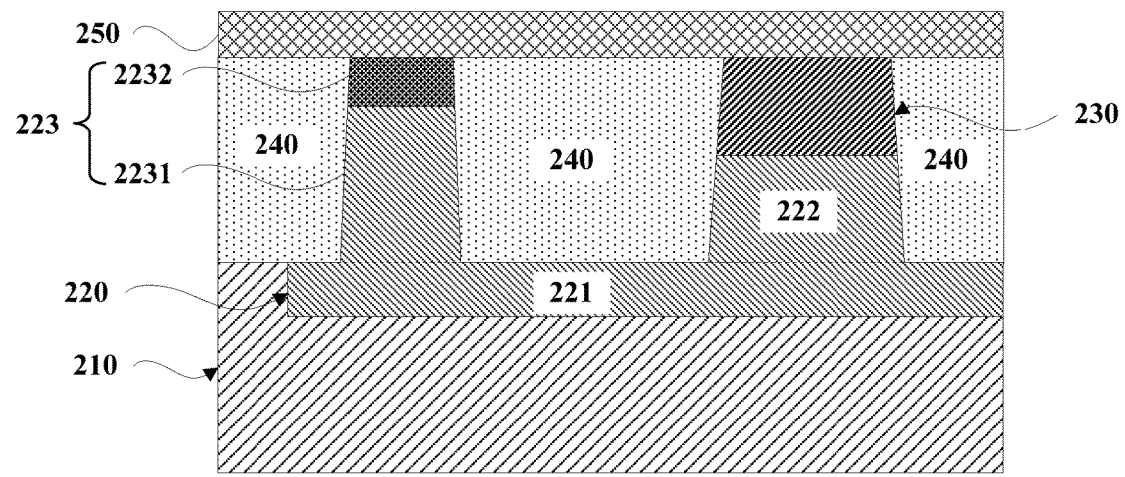

Referring to FIG. 2B, a process to form a doped semiconductor layer may comprise: forming an undoped semiconductor layer 250 on the semiconductor structure shown in FIG. 2A. That is, an undoped semiconductor layer 250 is formed on the emission region 230, the third base region 223, and the first groove isolation 240. The undoped semiconductor layer 250 may comprise poly-silicon.

Figure 2C:
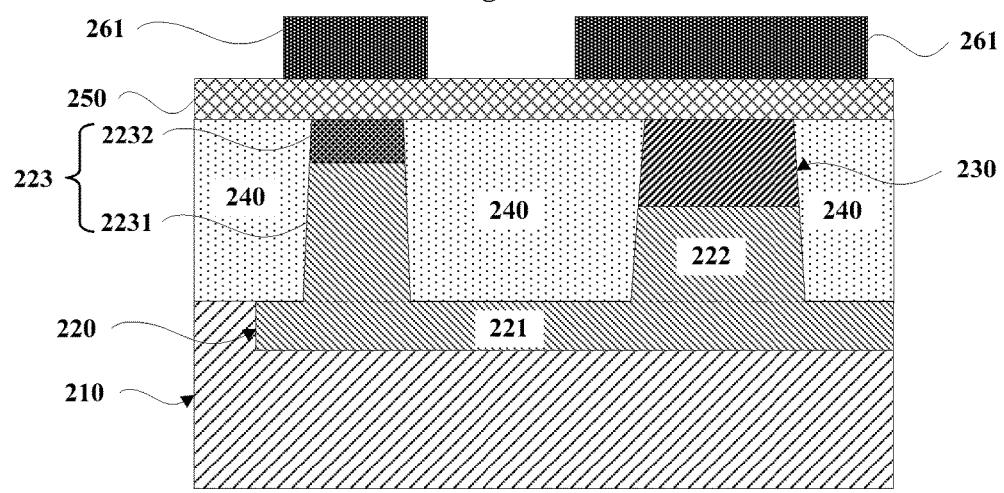
Figure 2D:
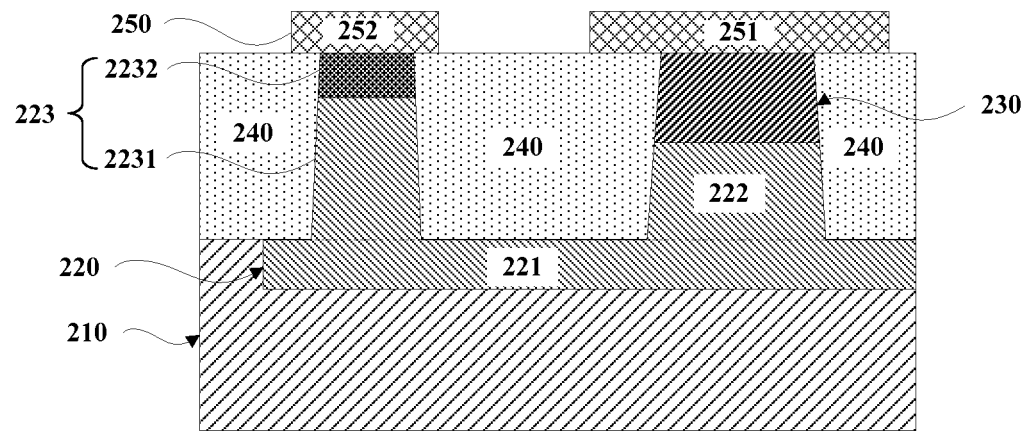

Next, referring to FIG. 2D, a process to form a doped semiconductor layer may further comprise: patterning the undoped semiconductor layer 250 to separate it into a first semiconductor component 251 and a second semiconductor component 252. The first semiconductor component 251 is on the emission region 230. For example, the first semiconductor component 251 can be on the emission region 230 and a portion of the first groove isolation 240 around the emission region 230. The width of the first semiconductor component 251 is larger than the width of the emission region 230. The second semiconductor component 252 is on the third base region 223. For example, the second semiconductor component 252 can be on the third base region 223 and a portion of the first groove isolation 240 around the third base region 223. Referring to FIG. 2C, the process to pattern the undoped semiconductor layer 250 may comprise: forming a first hard mask layer (e.g., photoresist) 261 on the undoped semiconductor layer 250; etching the undoped semiconductor layer 250 using the first hard mask layer 261 as a mask to form a patterned undoped semiconductor layer; and removing the first hard mask layer 261 to form a structure shown in FIG. 2D.

Figure 2E:
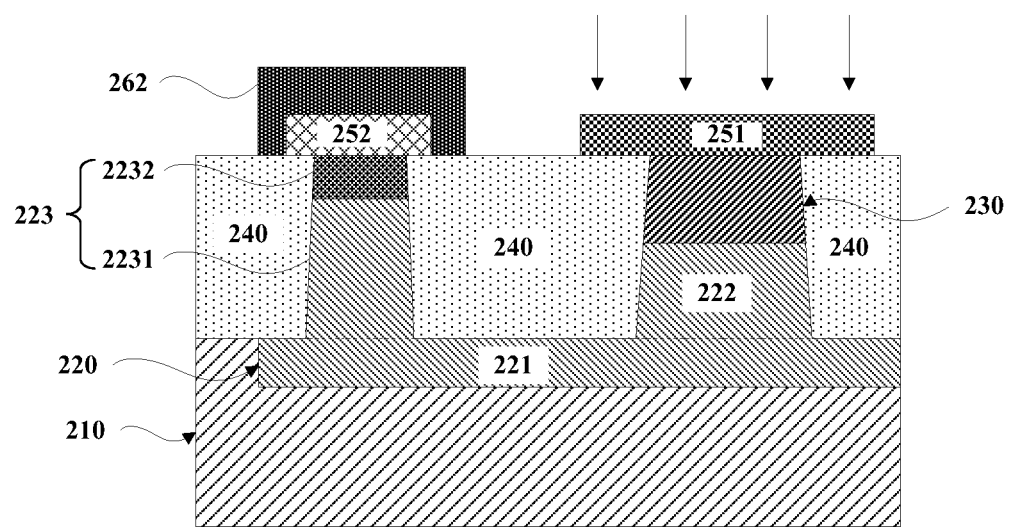

Next, referring to FIG. 2E, a process to form a doped semiconductor layer may further comprise: conducting a first doping process on the first semiconductor component 251 to make a conductive type of the first semiconductor component 251 the same as a conductive type of the emission region 230. Referring to FIG. 2E, in this process, a patterned second hard mask layer 262 is first formed to cover the second semiconductor component 252 while the first semiconductor component 251 remains exposed. Then the first doping process (e.g., ion implantation) is conducted on the first semiconductor component 251 to make the conductive type of the first semiconductor component 251 the same as the conductive type of the emission region 230. For example, when the conductive type of the emission region 230 is N type, then the impurities used in the first doping process are N type impurities (e.g., impurities comprising phosphorus or arsenic); when the conductive type of the emission region 230 is P type, then the impurities used in the first doping process are P type impurities (e.g., impurities comprising boron). Next, the second hard mask layer 262 is removed.

Figure 2F:
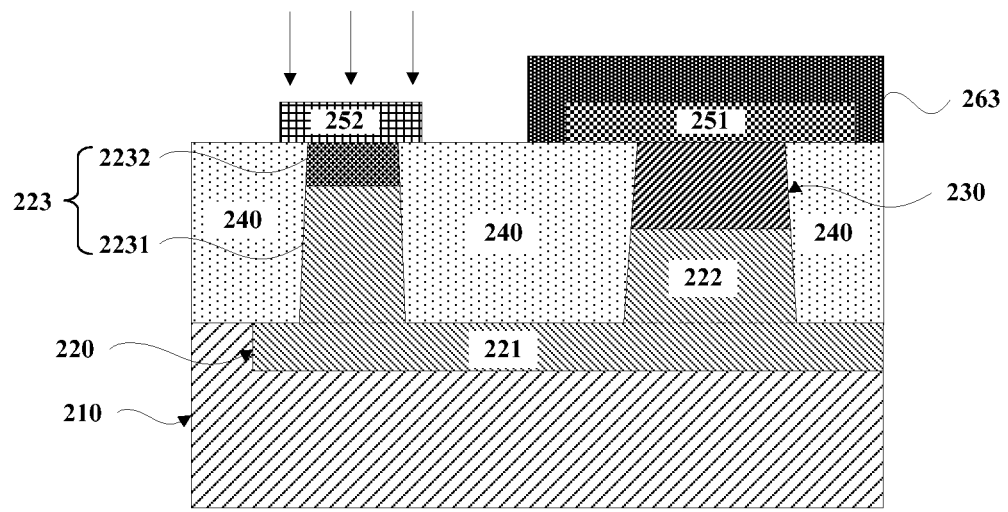

Next, referring to FIG. 2F, a process to form a doped semiconductor layer may further comprise: conducting a second doping process on the second semiconductor component 252 to make a conductive type of the second semiconductor component 252 the same as a conductive type of the base region 220. Referring to FIG. 2F, in this process, a patterned third hard mask layer 263 is first formed to cover the first semiconductor component 251 while the second semiconductor component 252 remains exposed. Then a second doping process (e.g., ion implantation) is conducted on the second semiconductor component 252 to make the conductive type of the second semiconductor component 252 the same as the conductive type of the base region 220. For example, when the conductive type of the base region 220 is P type, then the impurities used in the second doping process are P type impurities (e.g., impurities comprising boron); when the conductive type of the base region 220 is N type, then the impurities used in the second doping process are N type impurities (e.g., impurities comprising phosphorus or arsenic). Next, the third hard mask layer 263 is removed.

After these processes, a doped semiconductor layer, including the first semiconductor component 251, is formed on the emission region 230.

Figure 2G:
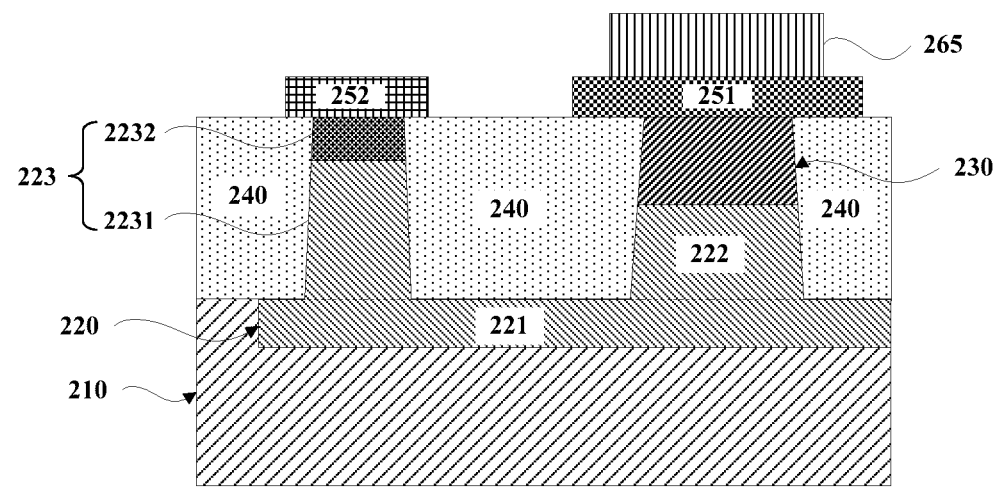

Next, referring to FIG. 2G the semiconductor device manufacturing method may further comprise: forming a block layer 265 on a portion of the first semiconductor component 251. The width of the block layer 265 is larger than the width of the emission region 230. For example, the block layer 265 may extend to cover a portion of the first semiconductor component 251 on the first groove isolation 240, as shown in FIG. 2G The block layer 265 may be a salicide block (SAB) layer.

Figure 2H:
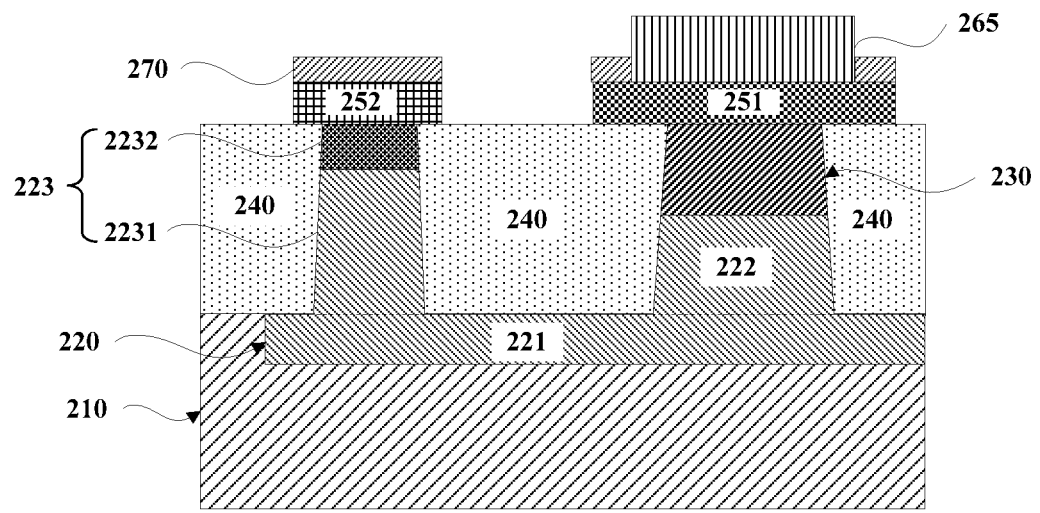

Next, referring to FIG. 2H, the semiconductor device manufacturing method may further comprise: forming a metal layer 270 on the second semiconductor component 252 and a portion of the first semiconductor component 251 not covered by the block layer 265. For example, the metal layer 270 may be made of cobalt (Co), titanium (Ti), or nickel (Ni). Optimally, the metal layer 270 can be a cobalt layer. In some embodiments, the metal layer 270 may also be formed on the first groove isolation 240. In succeeding processes to form a metal silicide layer, the metal layer 270 formed on the first groove isolation 240 (e.g., silicon dioxide) cannot be converted into a metal silicide layer because there is no semiconductor layer (e.g., the first semiconductor component 251 or the second semiconductor component 252) underneath that portion of the metal layer 270. Therefore after the metal layer 270 on the semiconductor layer (e.g., the first semiconductor component 251 or the second semiconductor component 252) is converted into a metal silicide layer, the metal layer 270 on the first groove isolation 240 can be removed by an etching process.

Figure 2I:
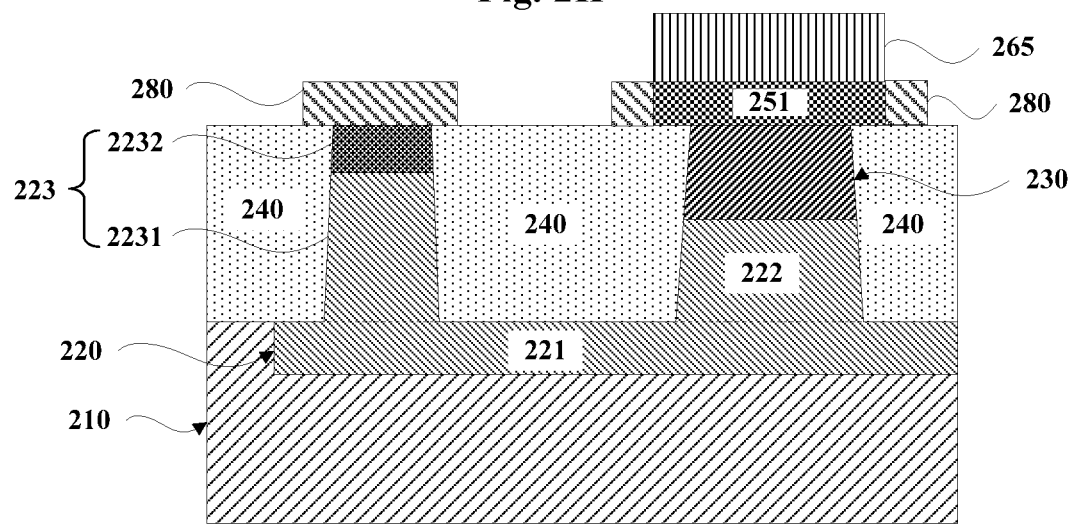

Next, referring to FIG. 2I, the semiconductor device manufacturing method may further comprise: forming a metal silicide layer 280 by conducting a heat treatment to make the metal layer 270 react with the semiconductor components (including a portion of the first semiconductor component 251 not covered by the block layer 265 and the second semiconductor component 252) it contacts. A portion of the metal silicide layer 280 is formed on the third base region 223 (e.g., the second part 2232), while another portion of the metal silicide layer 280 is formed on the second base region 222 and contacts the doped semiconductor layer (e.g., the first semiconductor component 251). The metal silicide layer 280 may be made of silicon cobalt compound (CoSi$_x$, where x is 1 or 2). Metal contact components (not shown in the drawings) may be formed on the metal silicide layer 280 to reduce the contact resistance.

Figure 2J:
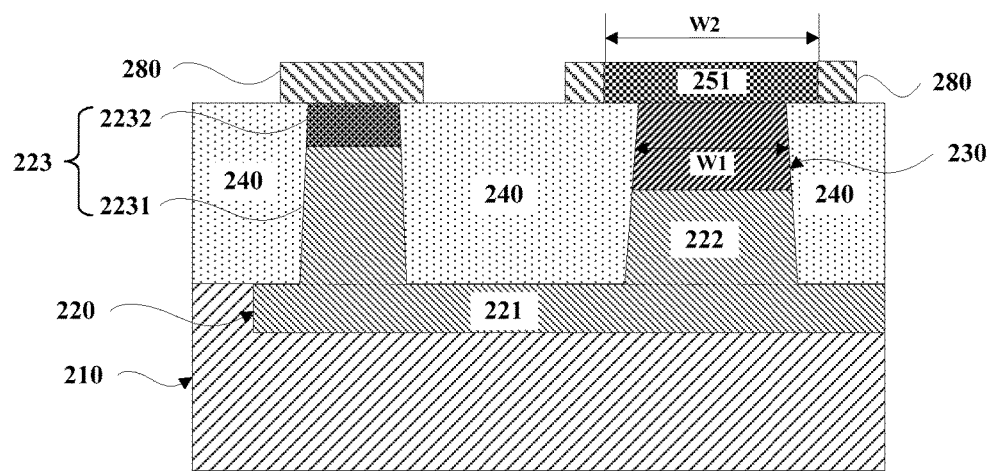

Next, referring to FIG. 2J, the semiconductor device manufacturing method may further comprise: removing the block layer 265 to form a semiconductor device in accordance with one embodiment of this inventive concept.

This concludes the description of a semiconductor device manufacturing method in accordance with one or more embodiments of this inventive concept. In this semiconductor device manufacturing method, a doped semiconductor layer is formed on the emission region and the groove isolation around the emission region. The doped semiconductor layer equivalently increases the width of the emission region, which in turn increases the DC amplification factor (β) and therefore improves the overall performance of the semiconductor device (e.g., a BJT).

This inventive concept further presents a semiconductor device. Referring to FIG. 2J, this semiconductor device comprises: a collection region 210; a base region 220 adjacent to the collection region 210; an emission region 230 adjacent to the base region 220; and a doped semiconductor layer 251 (e.g., the first semiconductor component 251 described above) on the emission region 230. The width W2 of the doped semiconductor layer 251 is larger than the width W1 of the emission region 230. A conductive type of the doped semiconductor layer 251 is the same as a conductive type of the emission region 230. For example, the doped semiconductor layer 251 may comprise poly-silicon.

In this application, the "width" of a component is measured along a direction perpendicular to a direction along which the first part 2231 and the second part 2232 of the third base region 223 are arranged, as illustrated by W1 and W2 in FIG. 2J.

In this embodiment, the width W2 of the doped semiconductor layer 251 is larger than the width W1 of the emission region 230. That equivalently increases the width of the emission region 230, which in turn increases the DC amplification factor (β) and therefore improves the overall performance of a semiconductor device (e.g., a BJT).

Referring to FIG. 2J, in one embodiment, the base region 220 may comprise a first base region 221, with the collection region 210 located on one side of the first base region 221. The base region 220 may further comprise a second base region 222 and a third base region 223, both located on a side of the first base region 221 opposite the side on which the collection region 210 is located. The second base region 222 and the third base region 223 are separated from each other, and the second base region 222 is located between the emission region 230 and the first base region 221.

In some embodiments, both the emission region and the collection region are N type, and the base region is P type; while in some other embodiments, both the emission region and the collection region are P type, and the base region is N type.

Referring to FIG. 2J, in one embodiment, the semiconductor device may further comprise a metal silicide layer 280 on the third base region 223 and the second base region 222, and contacting the doped semiconductor layer 251. The metal silicide layer 280 may be made of silicon cobalt compound (CoSi$_x$, where x is 1 or 2), titanium silicide, or nickel silicide. Metal contact components (not shown in the drawings) may be formed on the metal silicide layer 280 to reduce the contact resistance.

Referring to FIG. 2J, in one embodiment, the third base region 223 may comprise: a first part 2231 and a second part 2232 stacked together. The first part 2231 is located closer to the first base region 221 than the second part 2232, and a doping concentration of the second part 2232 is higher than a doping concentration of the first part 2231. The metal silicide layer 280 is formed on the second part 2232.

Referring to FIG. 2J, in one embodiment, the semiconductor device may further comprise a first groove isolation 240 separating the third base region 223 from the second base region 222 and the emission region 230. The doped semiconductor layer 251 may also be formed on a portion of the first groove isolation 240.

It should be understood that, although in FIG. 2J, the doped semiconductor layer 251 is on the emission region 230 and the metal silicide layer 280 contacting the doped semiconductor layer 251 is on the first groove isolation 240, the relative positions of these layers are not limited by FIG. 2J. For example, the doped semiconductor layer 251 and the metal silicide layer 280 contacting the doped semiconductor layer 251 may be placed to the left or to the right of their positions shown in FIG. 2J, and a portion of the metal silicide layer 280 may be formed on the emission region 230.

FIGS. 3A, 3B, 3C, 3D, 3E, 3F, 3G 3H, 3I, and 3J show schematic sectional views illustrating different stages of another semiconductor device manufacturing method in accordance with one or more embodiments of this inventive concept. This semiconductor device manufacturing method is described below in reference to these drawings.

Figure 3A:
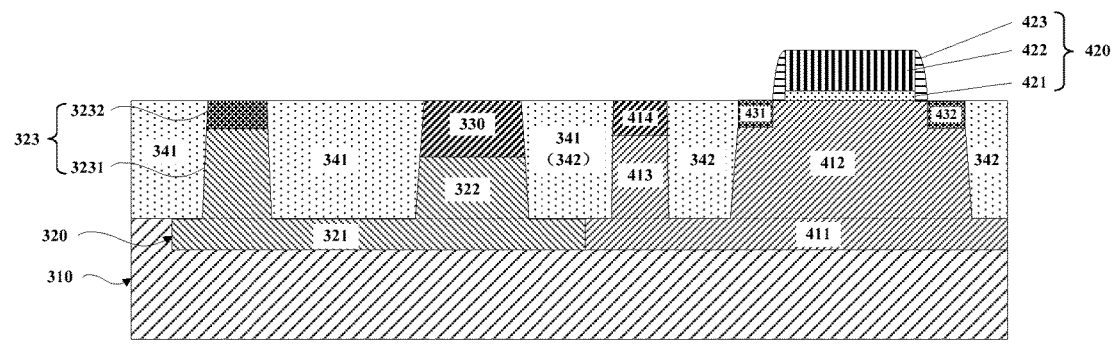
FIGS. 3A, 3B, 3C, 3D, 3E, 3F, 3G; 3H, 3I, and 3J show schematic sectional views illustrating different stages of another semiconductor device manufacturing method in accordance with one or more embodiments of this inventive concept.

First, referring to FIG. 3A, a semiconductor structure is provided. The semiconductor structure comprises a collection region 310, a base region 320, an emission region 330, and a first groove isolation 341. The base region 320 comprises a first base region 321, a second base region 322, and a third base region 323. In this semiconductor structure, the collection region 310, the base region 320, the emission region 330, the first groove isolation 341, the first base region 321, the second base region 322, and the third base region 323 in FIG. 3A are the same as or similar to, respectively, the collection region 210, the base region 220, the emission region 230, the first groove isolation 240, the first base region 221, the second base region 222, and the third base region 223 in FIG. 2A, therefore these components are not repeatedly described here. Additionally, similar to FIG. 2A, the third base region 323 in FIG. 3A may also comprise a first part 3231 and a second part 3232 stacked together.

Referring to FIG. 3A, in one embodiment, the semiconductor structure may further comprise a first well region 411 adjacent to the first base region 321 and positioned next to the first base region 321 along a first direction along which the second base region 322 and the third base region 323 are located. The semiconductor structure may further comprise a second well region 412 and a third well region 413 separately located along the first direction on a same side of the first well region 411. The semiconductor structure may further comprise a fourth well region 414 whose doping concentration is higher than a doping concentration of the third well region 413. The third well region 413 is located between the fourth well region 414 and the first well region 411. In one embodiment, the conductive types of the first well region 411, the second well region 412, the third well region 413, and the fourth well region 414 are the same. For example, they can all be either N type or P type. The third well region 413 and the fourth well region 414 may be used to elicit the first well region 411 and the second well region 412.

Referring to FIG. 3A, the semiconductor structure may further comprise a gate structure 420 on the second well region 412. The gate structure 420 may comprise a gate insulation layer (e.g., silicon dioxide) 421 on the second well region 412, a gate (e.g., poly-silicon) 422 on the gate insulation layer 421, and spacers 423 on two sides of the gate 422.

Referring to FIG. 3A, the semiconductor structure may further comprise a source region 431 and a drain region 432 located in the second well region 412 and on two sides of the gate structure 420. The conductive types of the source region 431 and the drain region 432 are opposite to the conductive type of the second well region 412. For example, when the conductive type of the second well region is N type, the conductive types of the source region 431 and the drain region 432 are P type; when the conductive type of the second well region is P type, the conductive types of the source region 431 and the drain region 432 are N type.

Referring to FIG. 3A, in one embodiment, the semiconductor structure may further comprise a second groove isolation 342 separating the second well region 412 from the third well region 413 and the fourth well region 414. The second groove isolation 342 comprises grooves around the second well region 412, the third well region 413 and the fourth well region 414, and an insulation layer (e.g., silicon dioxide) filling these grooves.

There also exists a groove isolation between the third well region 413 and the second base region 322. This groove isolation may be considered either as a part of the first groove isolation 341 or a part of the second groove isolation 342.

Figure 3B:
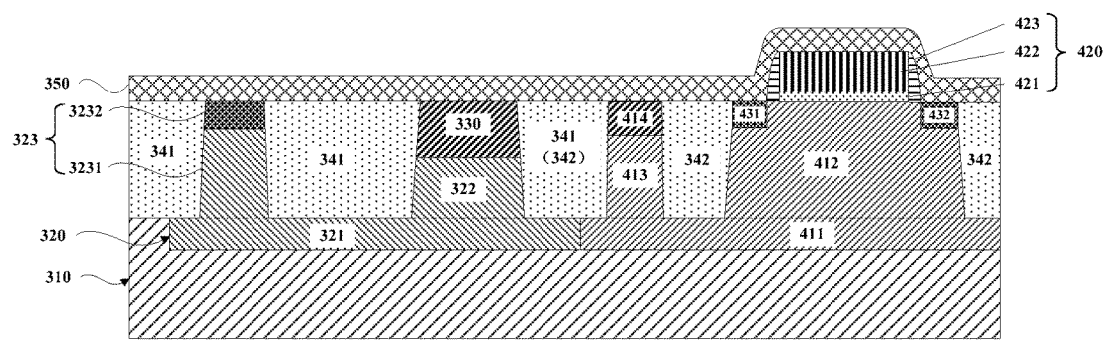

Next, referring to FIG. 3B, an undoped semiconductor layer 350 is formed on the semiconductor structure of FIG. 3A. That is, the undoped semiconductor layer 350 is formed on the emission region 330, the third base region 323, the first groove isolation 341, the second groove isolation 342, the gate structure 420, the source region 431, the drain region 432, and the fourth well region 414.

Figure 3C:
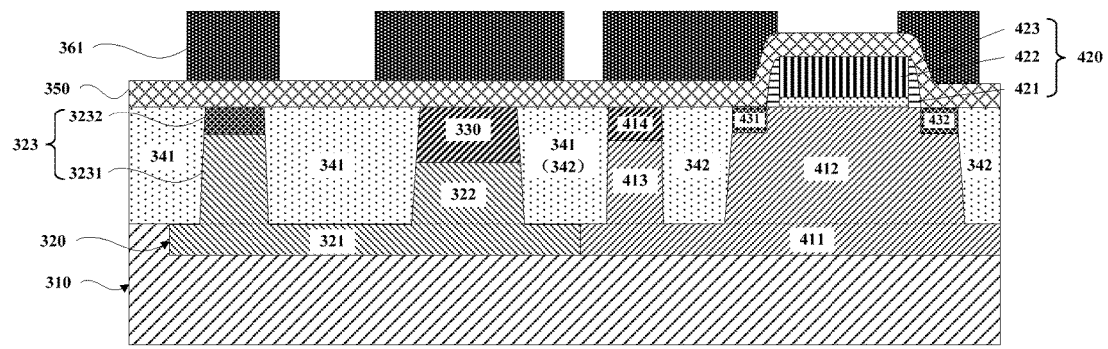

Next, referring to FIG. 3C, a patterned first hard mask layer (e.g., photoresist) 361 is formed on the undoped semiconductor layer 350.

Figure 3D:
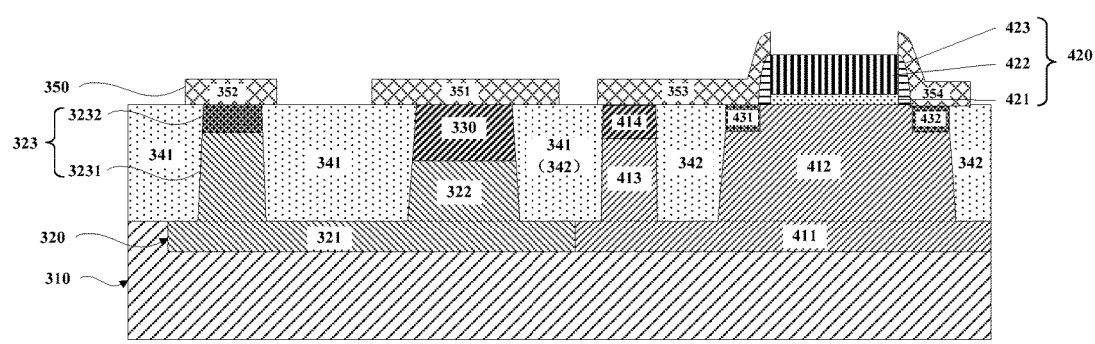

Next, referring to FIG. 3D, a patterned semiconductor layer is formed by etching the undoped semiconductor layer 350 using the first hard mask layer 361 as a mask. Then the first mask layer 361 is removed and the semiconductor structure shown in FIG. 3D is formed.

In the process to form the patterned semiconductor layer, the undoped semiconductor layer 350 is separated into a first semiconductor component 351 and a second semiconductor component 352. These two components are similar to, respectively, the first semiconductor component 251 and the second semiconductor component 252 as shown in FIG. 2D, and therefore are not repeatedly described here. Additionally, the undoped semiconductor layer 350 may be further separated into a third semiconductor component 353 separating from the first semiconductor component 351, and a fourth semiconductor component 354 separating from the third semiconductor component 353. Referring to FIG. 3D, the third semiconductor component 353 is on the source region 431 and the fourth well region 414, and the fourth semiconductor component 354 is on the drain region 432.

Figure 3E:
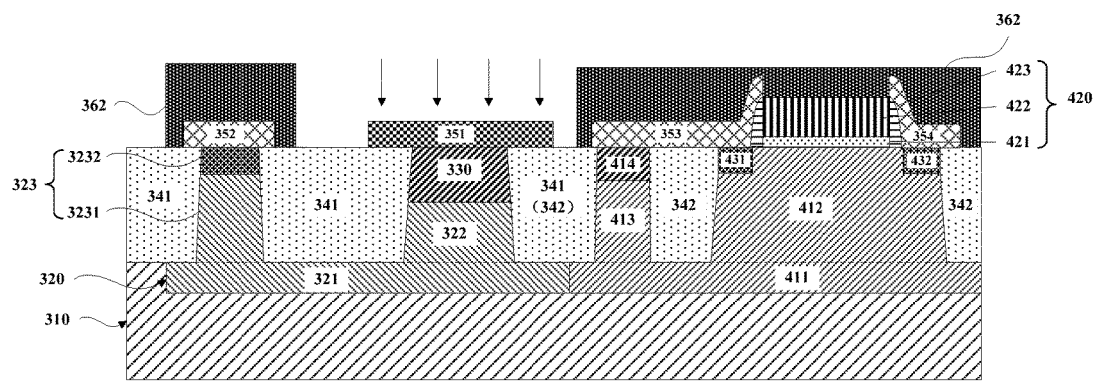

Next, referring to FIG. 3E, a first doping process is conducted on the first semiconductor component 351 to make a conductive type of the first semiconductor component 351 the same as a conductive type of the emission region 330. Referring to FIG. 3E and similar to the process described above, a second hard mask layer 362 may be formed before the first doping process to cover the semiconductor components that do not need to go through the first doping process, while the first semiconductor component 351 remains exposed. Then the first doping process (e.g., ion implantation) is conducted on the first semiconductor component 351, and the second hard mask layer 362 is removed after the first doping process.

Figure 3F:
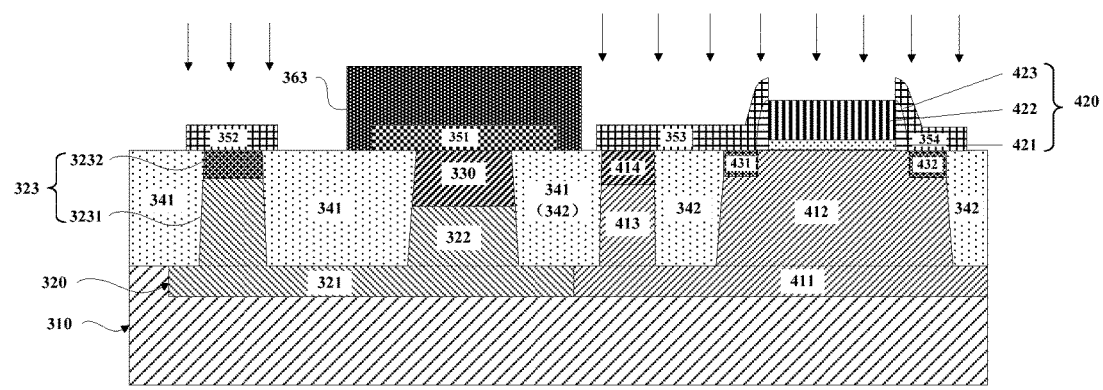

Next, referring to FIG. 3F, a second doping process is conducted on the second semiconductor component 352 to make a conductive type of the second semiconductor component 352 the same as a conductive type of the base region 320. In some embodiments, the conductive type of the base region 320 is the same as those of the source region 431 and the drain region 432. For example, the structure on the left half of FIG. 3F may be used to form a N-P-N type BJT (e.g., the conductive type of the base region 320 is P type), and the structure on the right half of FIG. 3F may be used to form a N type Field Effect Transistor (FET) (e.g., the conductive types of the source region 431 and the drain region 432 are P type). In this scenario, the second doping process is also conducted on the third semiconductor component 353 and the fourth semiconductor component 354. Referring to FIG. 3F, a third hard mask layer 363 may be formed before the second doping process to cover the first semiconductor component 351, while the semiconductor components that need to go through the second doping process remain exposed. Then the second doping process (e.g., ion implantation) is conducted on the exposed semiconductor components, and the third hard mask layer 363 is removed after the second doping process. Referring to FIG. 3F, in some embodiments, the second doping process may also be conducted on the gate.

Figure 3G:
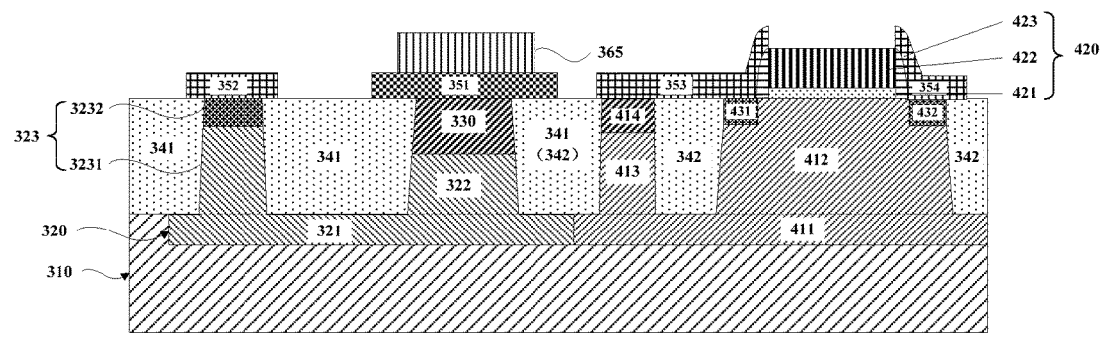
Figure 3H:
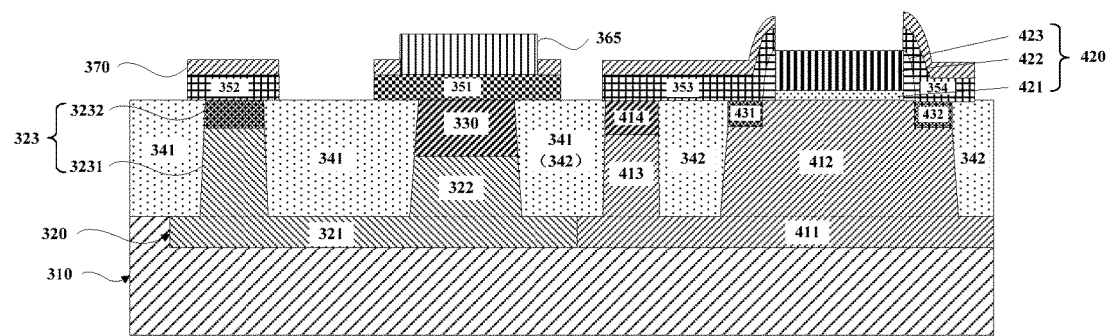

Next, referring to FIG. 3G, a block layer 365 may be formed on a portion of the first semiconductor component 351. The width of the block layer 365 is larger than the width of the emission region 330. For example, the block layer 365 can extend to cover a portion of the first semiconductor component 351 on the first groove isolation 341, as shown in FIG. 3G Next, referring to FIG. 3H, a metal layer 370 is formed on the semiconductor components not covered by the block layer 365.

Figure 3I:
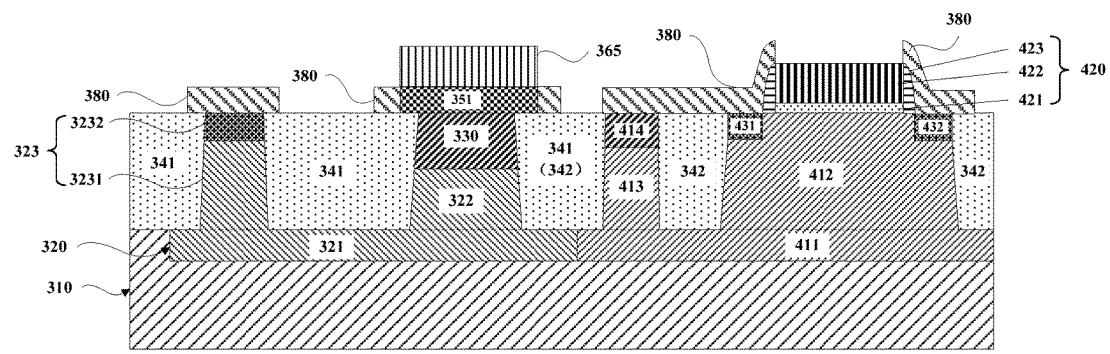

Next, referring to FIG. 3I, a metal silicide layer 380 is formed by conducting a heat treatment to make the metal layer 370 react with the semiconductor components it contacts.

Figure 3J:
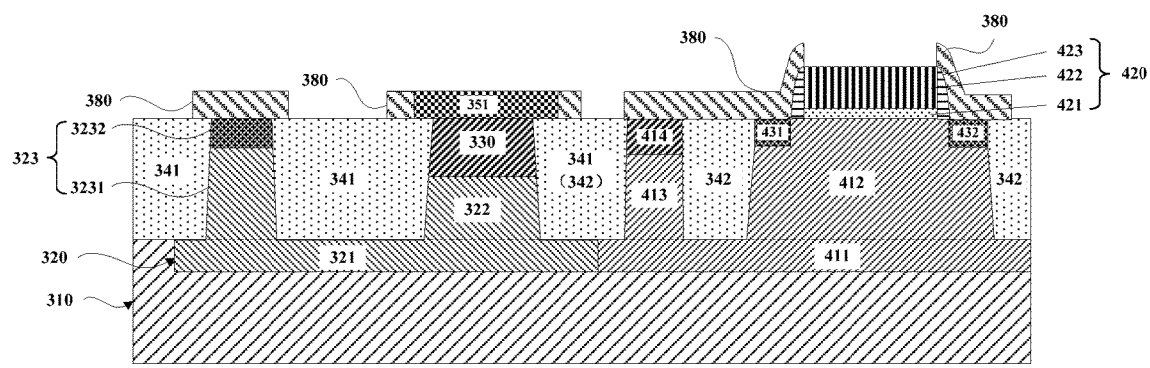

Next, referring to FIG. 3J, the block layer 365 is removed.

This concludes the description of another semiconductor device manufacturing method in accordance with one or more embodiments of this inventive concept. In this manufacturing method, when forming a doped semiconductor layer to equivalently increase the width of the emission region, a metal silicide layer is also formed on a source region and a drain region of a FET next to a BJT to extend the source region and the drain region. The metal silicide layer can work as an interconnect layer and have metal contact components formed on it. Thus, this design improves the overall performance of a device even when the device size is limited. The semiconductor device manufacturing method described above can be embedded into a baseline flow, it does not need additional hard mask and will not adversely affect the overall performance of a device. This semiconductor device manufacturing method increases the DC amplification factor (β) of a BJT and is also compatible to existing MOS transistor manufacturing methods.

Based on the semiconductor device manufacturing method described above, this inventive concept further presents a semiconductor device. Referring to FIG. 3J, this semiconductor device comprises a collection region 310, a base region 320, an emission region 330, and a doped semiconductor layer 351. These components are the same with or similar to, respectively, the collection region 210, the base region 220, the emission region 230, and the doped semiconductor layer 251 in FIG. 2J, therefore these components are not repeatedly described here.

Referring to FIG. 3J, in one embodiment, the semiconductor device may further comprise a first well region 411 adjacent to a first base region 321 and positioned next to the first base region 321 along a first direction along which a second base region 322 and a third base region 323 are arranged. The semiconductor structure may further comprise a second well region 412 and a third well region 413 separately located along the first direction on a same side of the first well region 411. The semiconductor device may further comprise a fourth well region 414 whose doping concentration is higher than the doping concentration of the third well region 413. The third well region 413 is located between the fourth well region 414 and the first well region 411. In one embodiment, the conductive types of the first well region 411, the second well region 412, the third well region 413, and the fourth well region 414 are the same.

Referring to FIG. 3J, in one embodiment, the semiconductor device may further comprise a gate structure 420 on the second well region 412. The gate structure 420 may comprise a gate insulation layer (e.g., silicon dioxide) 421 on the second well region 412, a gate (e.g., poly-silicon) 422 on the gate insulation layer 421, and spacers 423 on two sides of the gate 422.

Referring to FIG. 3J, in one embodiment, the semiconductor device may further comprise a source region 431 and a drain region 432 located in the second well region 412 and on two sides of the gate structure 420. The conductive types of the source region 431 and the drain region 432 are opposite to the conductive type of the second well region 412.

Referring to FIG. 3J, in one embodiment, the semiconductor device may further comprise a second groove isolation 342 separating the second well region 412 from the third well region 413 and the fourth well region 414.

Referring to FIG. 3J, in one embodiment, the semiconductor device may further comprise a metal silicide layer 380 on the source region 431, the fourth well region 414, and the drain region 432. The metal silicide layer 380 may be formed on the third base region 323 and on a portion of the first groove isolation 341 around the emission region 330. The metal silicide layer 380 may also be formed on the source region 431, the fourth well region 414, and the drain region 432. The width of the metal silicide layer 380 on the source region 431 is larger than the width of the source region 431, the width of the metal silicide layer 380 on the drain region 432 is larger than the width of the drain region 432. The metal silicide layer 380 can work as an interconnect layer and have metal contact components formed on it. This design equivalently increases the width the source region and the drain region, and improves the overall performance of a device even when the device size is limited.

This concludes the description of a semiconductor device and its manufacturing method in accordance with one or more embodiments of this inventive concept. For purposes of conciseness and convenience, some components or procedures that are well known to one of ordinary skill in the art in this field are omitted. These omissions, however, do not prevent one of ordinary skill in the art in this field to make and use the inventive concept herein disclosed.

While this inventive concept has been described in terms of several embodiments, there are alterations, permutations, and equivalents, which fall within the scope of this disclosure. It shall also be noted that there are alternative ways of implementing the methods and/or apparatuses of the inventive concept. Furthermore, embodiments may find utility in other applications. It is therefore intended that the claims be interpreted as including all such alterations, permutations, and equivalents. The abstract section is provided herein for convenience and, due to word count limitation, is accordingly written for reading convenience and shall not be employed to limit the scope of the claims.

What is claimed is:

1. A semiconductor device, comprising:
a collection region;
a base region adjacent to the collection region;
an emission region adjacent to the base region, wherein the base region comprises:
a first base region; and
a second base region, wherein the collection region is located on a first side of the first base region, the second base region is located on a second side of the first base region opposite the first side of the first base region, the second base region is located between the emission region and the first base region, is adjacent to the emission region, and has a width smaller than the width of the first base region; and
a doped semiconductor layer on the emission region, wherein the width of the doped semiconductor layer is larger than the width of the emission region, a conductive type of the doped semiconductor layer is the same as a conductive type of the emission region.

2. The device of claim 1, wherein the doped semiconductor layer comprises poly-silicon.

3. A semiconductor device, comprising:
a collection region;
a base region adjacent to the collection region;
an emission region adjacent to the base region; and
a doped semiconductor layer on the emission region, wherein the width of the doped semiconductor layer is larger than the width of the emission region, a conductive type of the doped semiconductor layer is the same as a conductive type of the emission region, wherein the base region comprises:
a first base region, wherein the collection region is located on a first side of the first base region;
a second base region; and
a third base region, wherein both the second base region and the third base region are located on a second side of the first base region opposite the first side of the first base region, the second base region and the third base region are separated from each other, and the second base region is located between the emission region and the first base region.

4. The device of claim 3, further comprising:
a metal silicide layer on a portion of the third base region and a portion of the second base region adjacent to the doped semiconductor layer.

5. The device of claim 4, wherein the third base region comprises:

a first part and a second part stacked together, wherein the first part is located closer to the first base region than the second part, a doping concentration of the second part is higher than a doping concentration of the first part, and the second part has the metal silicide layer formed thereon.

6. The device of claim 3, further comprising:
a first well region adjacent to the first base region and positioned next to the first base region along a first direction along which the second base region and the third base region are located;
a second well region and a third well region separately located along the first direction on a same side of the first well region;
a fourth well region whose doping concentration is higher than a doping concentration of the third well region, wherein the third well region is located between the fourth well region and the first well region;
a gate structure on the second well region; and
a source region and a drain region both located in the second well region and on two sides of the gate structure.

7. The device of claim 6, further comprising:
a metal silicide layer on the source region, the fourth well region, and the drain region.

8. The device of claim 3, further comprising:
a first groove isolation separating the third base region from the second base region and the emission region.

9. The device of claim 6, further comprising:
a second groove isolation separating the second well region from the third well region and the fourth well region.

10. A semiconductor device manufacturing method, comprising:
providing a semiconductor structure, wherein the semiconductor structure comprises a collection region, a base region adjacent to the collection region, and an emission region adjacent to the base region, wherein the base region comprises:
a first base region; and
a second base region, wherein the collection region is located on a first side of the first base region, the second base region is located on a second side of the first base region opposite the first side of the first base region, the second base region is located between the emission region and the first base region, is adjacent to the emission region, and has a width smaller than the width of the first base region; and
forming a doped semiconductor layer on the emission region, wherein the width of the doped semiconductor layer is larger than the width of the emission region, and a conductive type of the doped semiconductor layer is the same as a conductive type of the emission region.

11. The method of claim 10, wherein the doped semiconductor layer comprises poly-silicon.

12. The method of claim 10, wherein the base region comprises:
a first base region, wherein the collection region is located on a first side of the first base region;
a second base region; and
a third base region, wherein both the second base region and the third base region are located on a second side of the first base region opposite the first side of the first base region, the second base region and the third base region are separated from each other, and the second base region is located between the emission region and the first base region.

13. The method of claim 12, wherein forming a doped semiconductor layer on the emission region comprises:
forming an undoped semiconductor layer on the semiconductor structure;
patterning the undoped semiconductor layer to separate it into a first semiconductor component and a second second semiconductor component, wherein the first semiconductor component is on the emission region, the width of the first semiconductor component is larger than the width of the emission region, and the second semiconductor component is on the third base region;
conducting a first doping process on the first semiconductor component to make a conductive type of the first semiconductor component the same as a conductive type of the emission region; and
conducting a second doping process on the second semiconductor component to make a conductive type of the second semiconductor component the same as a conductive type of the base region.

14. The method of claim 13, further comprising:
forming a block layer on a portion of the first semiconductor component;
forming a metal layer on the second semiconductor component and a portion of the first semiconductor component not covered by the block layer;
forming a metal silicide layer by conducting a heat treatment to make the metal layer react with the semiconductor components it contacts, wherein a portion of the metal silicide layer is formed on the third base region and another portion of the metal silicide layer is formed on the second base region and contacts the doped semiconductor layer; and
removing the block layer.

15. The method of claim 14, wherein the third base region comprises:
a first part and a second part stacked together, wherein the first part is located closer to the first base region than the second part, a doping concentration of the second part is higher than a doping concentration of the first part, and the second part has the metal silicide layer formed on it.

16. The method of claim 13, wherein the semiconductor structure further comprises:
a first well region adjacent to the first base region and positioned next to the first base region along a first direction along which the second base region and the third base region are located;
a second well region and a third well region separately located along the first direction on a same side of the first well region;
a fourth well region whose doping concentration is higher than a doping concentration of the third well region, wherein the third well region is located between the fourth well region and the first well region;
a gate structure on the second well region; and
a source region and a drain region both located in the second well region and on two sides of the gate structure.

17. The method of claim 16, wherein when patterning the undoped semiconductor layer, the undoped semiconductor layer is further separated into a third semiconductor component separating from the first semiconductor component, and a fourth semiconductor component separating from the third semiconductor component, and wherein the third semiconductor component is on the source region and the fourth well region, and the fourth semiconductor component is on the drain region.

18. The method of claim 17, wherein conductive types of the base region, the source region, and the drain region are the same, and wherein when conducting the second doping process on the second semiconductor component, the second doping process is also conducted on the third semiconductor component and the fourth semiconductor component.

19. The method of claim 12, wherein the semiconductor structure further comprises:
   a first groove isolation separating the third base region from the second base region and the emission region.

20. The method of claim 16, wherein the semiconductor structure further comprises:
   a second groove isolation separating the second well region from the third well region and the fourth well region.

* * * * *